(12) United States Patent
Hamaoka et al.

(10) Patent No.: US 6,704,202 B1
(45) Date of Patent: Mar. 9, 2004

(54) POWER CONTROLLER AND COMPRESSOR FOR REFRIGERATION SYSTEM

(75) Inventors: Koji Hamaoka, Osaka (JP); Keiji Ogawa, Yamatokoriyama (JP); Tomonori Nakano, Higashiosaka (JP)

(73) Assignee: Matsushita Refrigeration Company (JP)

(*) Notice: Subject to any disclaimer, the term of this patent is extended or adjusted under 35 U.S.C. 154(b) by 133 days.

(21) Appl. No.: 10/009,448

(22) PCT Filed: Jun. 9, 2000

(86) PCT No.: PCT/JP00/03740
§ 371 (c)(1),
(2), (4) Date: Apr. 9, 2002

(87) PCT Pub. No.: WO00/78111
PCT Pub. Date: Dec. 21, 2000

(30) Foreign Application Priority Data

Jun. 15, 1999 (JP) .......................... 11/167919

(51) Int. Cl.⁷ .......................... H05K 7/20; F25B 41/00
(52) U.S. Cl. .......................... 361/704; 62/259.2; 62/505; 361/707; 361/710; 361/715; 361/719; 361/690; 417/366
(58) Field of Search .............. 62/259.2, 505; 361/688, 690, 698–707, 709, 710, 715, 719–721, 801, 803; 417/410.1, 366, 370–373

(56) References Cited

U.S. PATENT DOCUMENTS

| | | | |
|---|---|---|---|
| 4,709,560 A | * 12/1987 | Voorhis et al. | ............. 361/695 |
| 5,740,527 A | 4/1998 | Mitama | |
| 5,946,192 A | * 8/1999 | Ishigami et al. | ............. 361/704 |
| 6,041,609 A | * 3/2000 | Hornsleth et al. | ............. 62/259.2 |

FOREIGN PATENT DOCUMENTS

| | | |
|---|---|---|
| JP | 56-14155 | 10/1981 |
| JP | 61-288794 | 12/1986 |
| JP | 62-92858 | 4/1987 |
| JP | 62-141482 | 6/1987 |
| JP | 62-140765 | 9/1987 |
| JP | 2-49400 | 4/1990 |
| JP | 5-13562 | 1/1993 |
| JP | 5-312167 | 11/1993 |
| JP | 6-129918 | 5/1994 |
| JP | 6-165527 | 6/1994 |
| JP | 7-131130 | 5/1995 |
| JP | 8-128710 | 5/1996 |
| JP | 8-148876 | 6/1996 |
| JP | 9-283883 | 10/1997 |
| JP | 10-227489 | 8/1998 |
| JP | 10-259930 | 9/1998 |

* cited by examiner

*Primary Examiner*—Gregory D. Thompson
(74) *Attorney, Agent, or Firm*—Parkhurst & Wendel, L.L.P.

(57) ABSTRACT

The present invention solves a problem that a power controller be large in a refrigerating system, and provides a compact-size as well as an inexpensive power controller. Highly heat-dissipating first board 1 including an inverter circuit mounted thereon and second board including a control circuit mounted thereon are placed in parallel with each other and accommodated by case 9. Case 9 has slits through which heat sink 2 and connector 6 can extend outside case 9, and further has fixing section 11 for fixing case 9 to a compressor. This structure allows the power controller to dissipate heat in an optimum manner and to be downsized, and also allows the compressor to integrate the controller thereinto. A capacity that the controller occupies in the refrigerating system can be substantially reduced.

5 Claims, 10 Drawing Sheets

POWER CONTROLLER AND COMPRESSOR FOR REFRIGERATION SYSTEM

TECHNICAL FIELD

The present invention relates to a power controller, such as an inverter, for driving a compressor motor of a refrigerating system at variable speeds.

BACKGROUND ART

As power electronics has progressed recently, power controllers are employed in various fields. For instance, an inverter is used in a refrigerator and air cleaner for saving energy, and contributes greatly to energy saving of the apparatuses. The power controller has encountered a problem of how to dissipate heat from power elements, and various improvements have been carried out for the problem.

Figure 10:
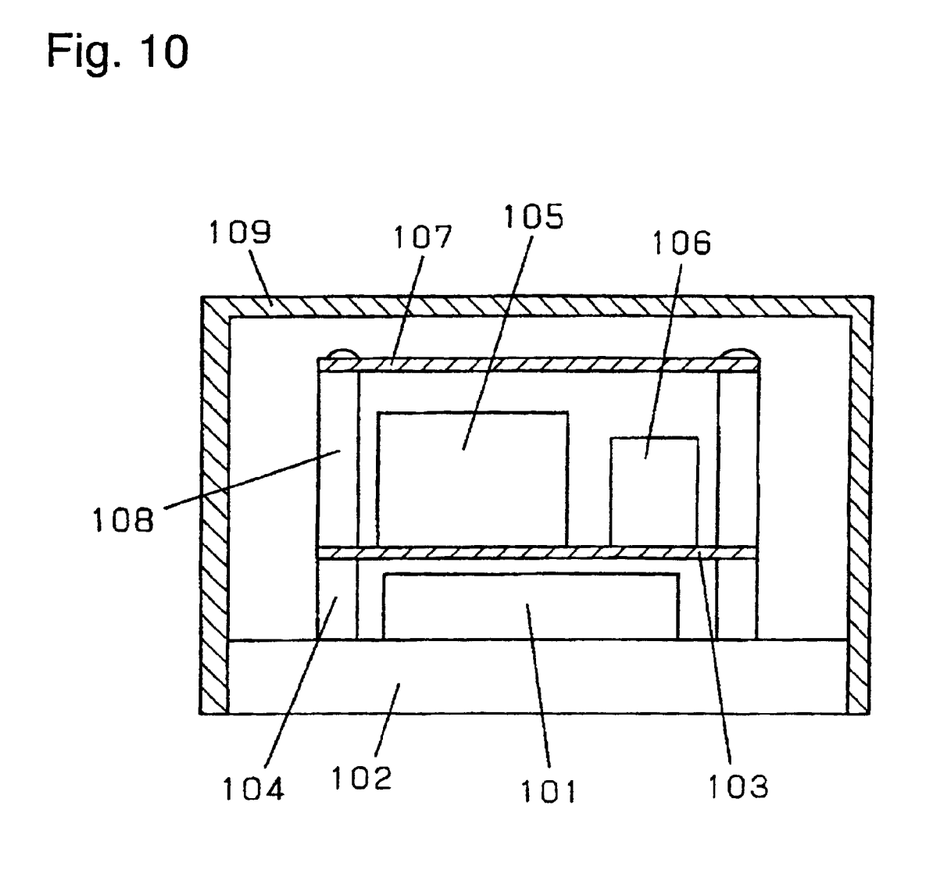
FIG. 10 is a sectional view of a conventional power controller.

The Japanese Patent Laid-Open Publication No.09-283883 discloses a conventional power controller. FIG. 10 is a sectional view of the conventional power controller. Power converter 101 generates greater heat than the other components in the power controller. Large size radiator 102 is mounted to power converter 101 for dissipating the generated heat. First circuit board 103 is electrically connected to power converter 101, and mounted with smoothing capacitor 105 and voltage regulator 106 generating control-power-supply. First spacer 104 rigidly bonds radiator 102 to first circuit board 103. On second circuit board 107, controlling components such as a microprocessor (not shown) is mainly mounted. Second spacer 108 rigidly bonds first circuit board 103 to second circuit board 107. Cover 109 is mounted for covering these circuit components.

The conventional power controller discussed above has a problem that the controller itself has a large size. Particularly in a refrigerating system, e.g., a refrigerator, an available capacity of the system decreases as the power controller becomes large. The larger size controller requires a greater number of assembling steps to be assembled, and this increases a cost of the system.

DISCLOSURE OF THE INVENTION

In a power controller of the present invention, a controlling board is directly mounted to a compressor and thus, integrated with the compressor. CD This structure allows the controlling board to occupy a substantially less space.

A first board and second board bonded to each other with resin are directly mounted to a compressor. This structure allows the power controller to be reinforced and not to be affected by vibrations.

When a case of the power controller is mounted to the compressor, a temperature detector, which protects the compressor, is adheres to the compressor solidly and fixed to resilient supporting member. This structure reduces a number of steps for mounting a temperature protector to the compressor, and reduces a number of assembling steps to assemble the controller.

The second board being larger than the first board is prepared, and high-profile components to be mounted to the second board are placed around the first board. This arrangement can further slim down the power controller, and reduces substantially the capacity that the controller occupies.

An electrolytic capacitor is disposed on the second board, then a resin is flowed between the first and second boards until burying one third of the capacitor in height. The resin rigidly bonds the first and second boards. This structure not only further thins the power controller and reduces substantially the capacity that the controller occupies, but also reinforces the power controller, thus allowing the board to avoid being subject to vibrations.

The board, upon being directly mounted to the compressor, can downsize the controller. A case containing the controlling board, upon being mounted to a bracket of the compressor, can prevent a power-supplying pin from a weight stress and thus avoid the pin to be damaged.

DETAILED DESCRIPTION OF THE PREFERRED EMBODIMENTS

Exemplary Embodiment 1

Figure 1:
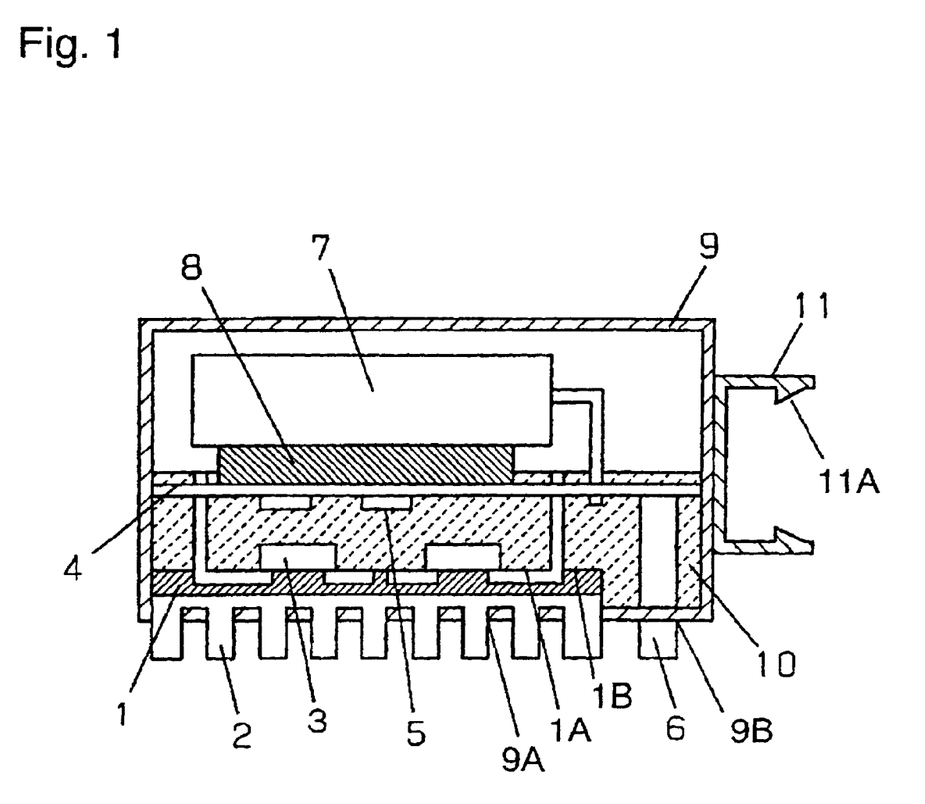
FIG. 1 is a sectional view of a power controller of a refrigerating system in accordance with exemplary embodiment 1.

FIG. 1 is a sectional view of a power controller of a refrigerating system in accordance with exemplary embodiment 1, and is a horizontal sectional view with respect to a mounted compressor.

First board 1 includes lead-frame 1A and highly heat-conductive resin sheet 1B unitarily molded with each other to which heat and pressure is applied. Lead-frame 1A is made of copper plate of 0.5 mm thickness cut into patterns. Resin sheet 1B is made of thermosetting resin, e.g., epoxy, and highly heat-conductive material, e.g., aluminum oxide. First board 1 thus exhibits efficient heat dissipation. When heat and pressure are applied to these elements, heat sink 2 can be added to the elements for being unitarily molded.

Power element 3, which functions as a major component in the power controller, is a heating component such as a MOS FET or an IGBT. A rectifier diode is also one of heating components. These heating components 3 are mounted on first board 1. A controlling circuit including microprocessor 5, connector 6 and the like mounted to second board 4, which is made of ordinary paper phenol or glass epoxy. First board 1 is placed in parallel with second board 4, and lead frame 1A couples first board 1 with second board 4. Lead frame 1A is bent after the unitary molding and the components mounting.

Smoothing capacitor 7 is connected to the rectifier diode, and lowers a DC ripple voltage undergone the rectifying. Smoothing capacitor 7 is coupled to second board 4 via lead-wires, and placed opposite to heat sink 2 with respect to second board 4. This placement allows capacitor 7 to be hardly subject to the heat generated by heating components 3. Capacitor 7 is also hardly subject to vibrations as being rigidly mounted to second board 4 with resin 8.

Case 9 accommodates first board 1, second board 4, and smoothing capacitor 7 compactly. Case 9 has slit 9A through which heat sink 2 mounted to first board 1 extends outside of case 9, and also has slit 9B through which connector 6 mounted to second board 4 extends outside of case 9.

Heat sink 2, since being exposed outside case 9 from slit 9A, has an improved heat dissipation, which restrains the temperature rise of heating components 3. Connector 6, since being exposed outside case 9 from slit 9B, allows an outer circuit to be connected thereto easily.

Filler resin 10, e.g., silicone resin, has fluidity at an initial filling stage, and is used for burying first board 1 and second board 4. After that, resin 10 is hardened by heating or so. First board 1 and second board 4 are thus fixed keeping in parallel, so that connection strength against vibrations between the boards increases.

Fixing section 11, which fixes the power controller of the refrigerating system to a compressor, is provided to case 9 on the compressor side. Protrusions 11A are provided inside fixing section 11 for mating with a mounting section of the compressor. The compressor is thus rigidly mounted to fixing section 11.

Figure 2:
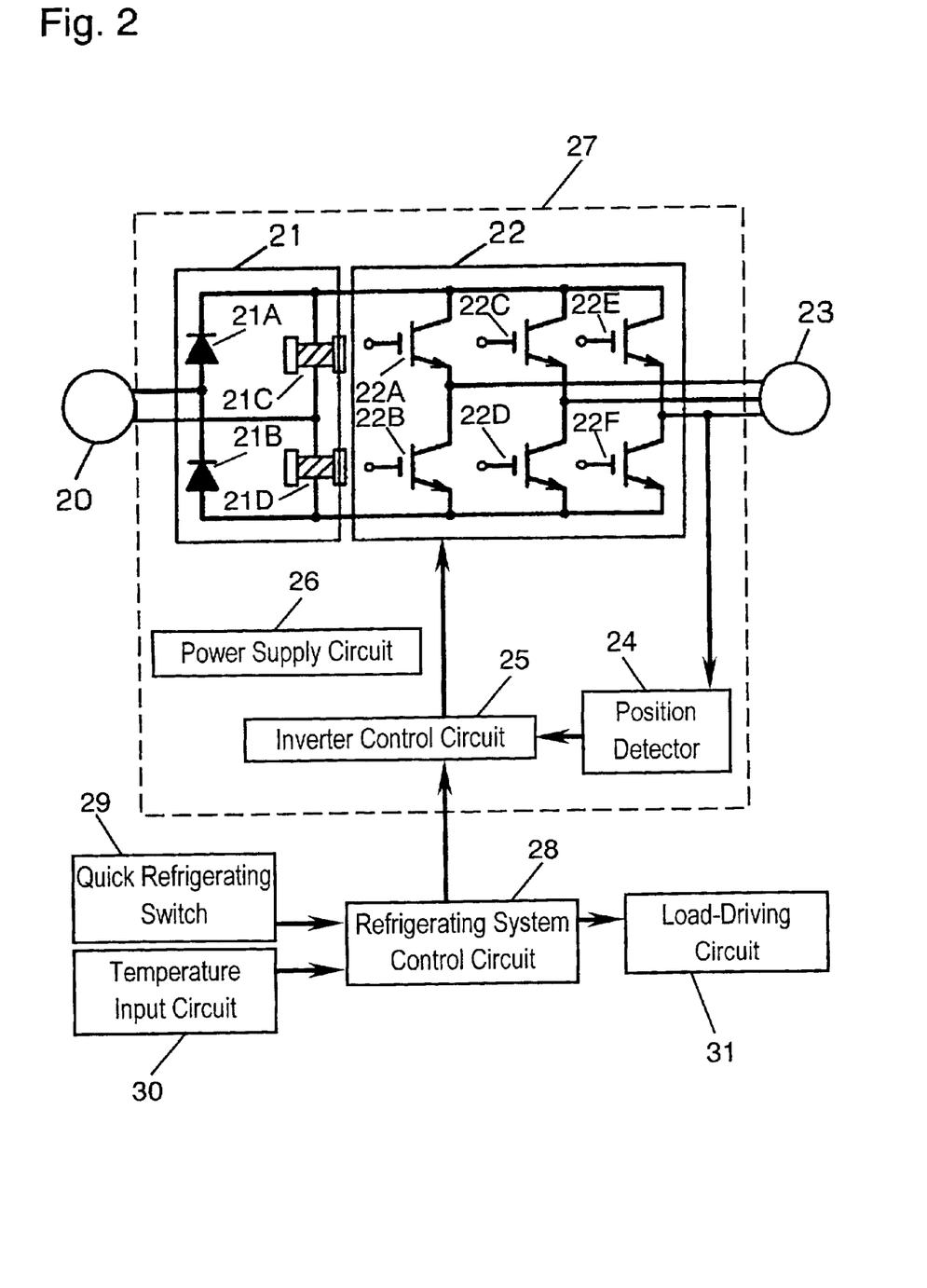
FIG. 2 is a circuit diagram of a power controller of a refrigerating system in accordance with the present invention.

FIG. 2 is a circuit diagram of the power controller of the refrigerating system in accordance with the present invention. The power controller, namely, an inverter drives a compressor motor of the refrigerating system at variable speeds. Regarding commercial power source 20, power of 100V, 50 Hz or 60 Hz is available in most of Japanese private homes. Converter 21 converts AC of commercial power source 20 into DC. Converter 21 includes bridge-connected two rectifier diodes 21A and 21B and provides commercial power source 20 with double-voltage rectifying. Electrolytic capacitors 21C and 21D are connected between positive voltage output from rectifier diode 21A, negative voltage output from diode 21B and another power line respectively, and smoothes the voltage undergone double-voltage rectifying to produce DC voltage (approx. 280V) double the input voltage.

Inverter 22 receives the DC voltage output from converter 21 and converts the DC voltage to a three-phase AC power having an arbitrary frequency and an arbitrary voltage. In inverter 22, IGBT 22A–IGBT 22F are connected respectively in three-phase bridge, and respectively connected to high-speed diodes (not shown) in parallel. In these diodes, circulating currents generated when IGBT 22A–IGBT 22F are turned off flow.

Motor 23 is driven by three-phase AC output from inverter 22. A highly efficient brushless DC motor is used as motor 23. The brushless DC motor has magnets in the rotor, thus efficient operation can be expected. Motor 23 rotates at a speed responsive to an output frequency of inverter 22.

Position-detecting circuit 24 detects a relative rotational position of the rotor of motor 23 based on back electromotive force of the motor.

Using a microprocessor and the like, inverter control circuit 25 produces a waveform for driving IGBTs 22A–22F of inverter 22 based on the resultant position detected by position detecting circuit 24. Control circuit 25 detects an abnormality of inverter 22 and takes protective action.

Power supply circuit 26 receives DC output from converter 21, and outputs the power activating position detecting circuit 24 and inverter control circuit 25.

Power controller 27 thus includes converter 21, inverter 22, position detecting circuit 24, inverter control circuit 25 and power supply circuit 26.

Refrigerating system control circuit 28 is disposed outside power controller 27. This control circuit 28 controls the entire refrigerating system, determines a rotation speed of the compressor, and gives an instruction about the rotation speed to inverter control circuit 25. This instruction is delivered via, e.g., serial communication.

Quick refrigerating switch 29 is disposed on a side at a user of the refrigerating system. When the user presses the switch to refrigerate something quickly, refrigerating system control circuit 28 raises the rotation speed of the compressor, and instructs inverter control circuit 25 to realize this rotation speed. Temperature input circuit 30 detects a temperature in a compartment of the refrigerating system (e.g., in a case of a refrigerator, the temperature of the refrigerator compartment.) Based on an output of temperature input circuit 30, refrigerating system control circuit 28 determines the rotation speed of the compressor, and sends an instruction signal to inverter control circuit 25. Load-driving circuit 31 driven by refrigerating-system-control circuit 28 drives a fan motor, a defrosting heater (not shown) and the like.

Mounting the components in the power controller is detailed hereinafter. The power controller of the refrigerating system shown in FIG. 1 incorporates power controller 27 shown in FIG. 2 into case 9. Refrigerating system control circuit 28 is disposed at a place different from controller 27, such as behind the refrigerating system.

In FIG. 1, heating components 3 mounted on first board 1 are rectifier diodes 21A, 21B, and IGBT 22A–22F. Because the power for driving motor 23 runs through these components, great amount of loss and heat are generated. Each of these heating components is mounted on first board 1. On second board 4, inverter control circuit 25 including such as a microprocessor, position detecting circuit 24, power supply circuit 26 are mounted.

Figure 3:
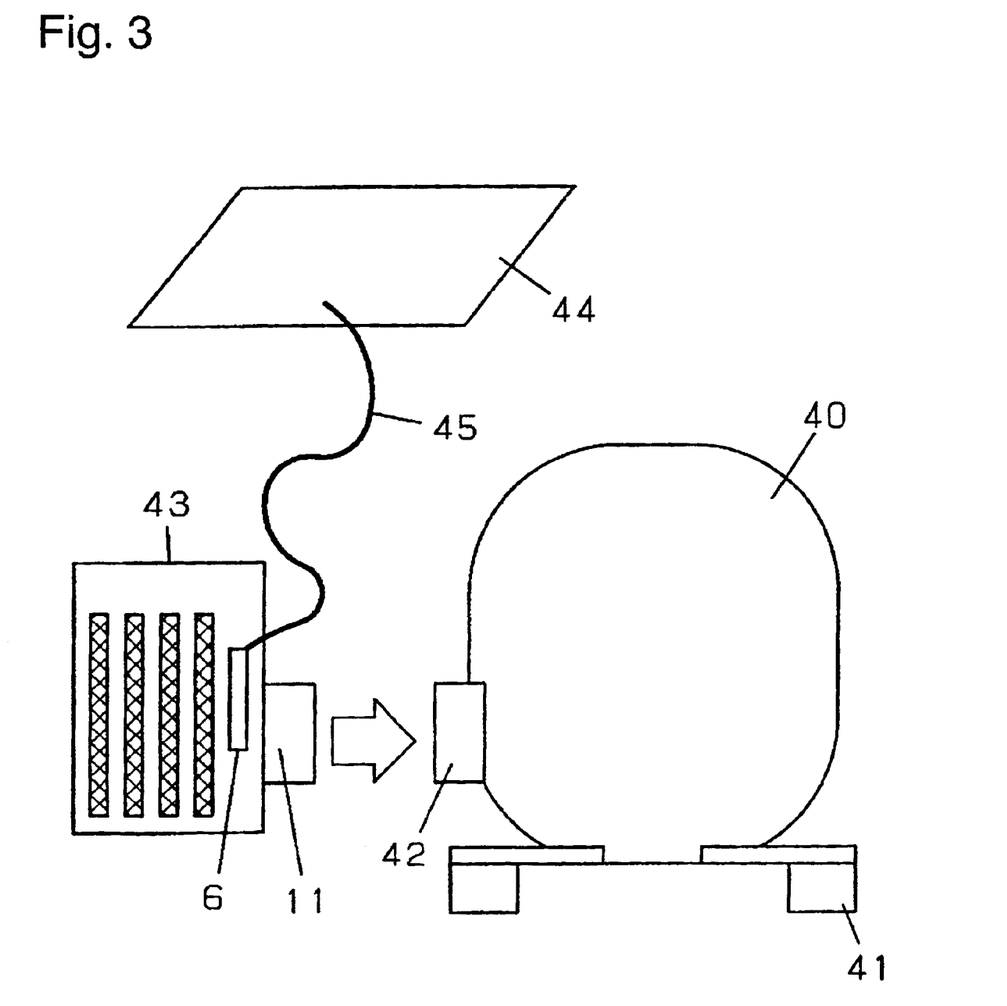
FIG. 3 illustrates connections of the power controller in accordance with embodiment 1.

FIG. 3 illustrates connections of the power controller of the refrigerating system in accordance with embodiment 1. Compressor 40 compresses coolant gas (e.g., HFC-134a) by spinning the motor therein. The compressed coolant gas circulates through the refrigerating system (not shown), including a condenser, a de-compressor and an evaporator, for cooling. Rubber isolator 41 prevents the compressor 40 from vibrations conveyed to the body of the refrigerating system. Mounting bracket 42 connects compressor 40 to power controller 43 and fixes them at fixing section 11. Bracket 42 has holes for engaging with protrusions 11A of fixing section 11, and is fixed to controller 43. Refrigerating system control board 44 is mounted with refrigerating system control circuit 28 shown in FIG. 2 and the like. An instruction about the rotation speed and so on from refrigerating system control board 44 is supplied through connector 6 of the power controller via communication cable 45.

Figure 4:
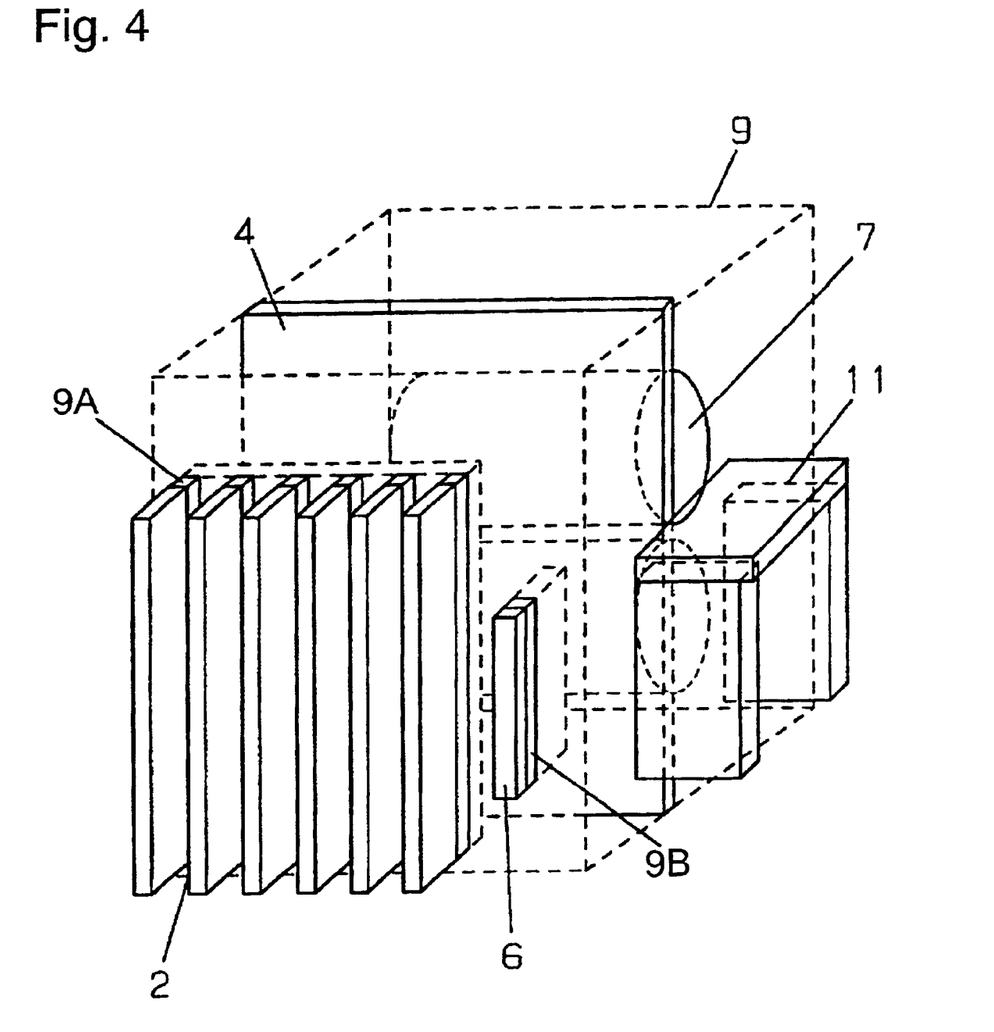
FIG. 4 is a perspective view of the power controller in accordance with embodiment 1.

FIG. 4 is a perspective view of the power controller in accordance with embodiment 1. Fixing section 11 is fixed to case 9. Fixing section 11 has protrusions (not shown) in three directions except the downward direction for engaging with mounting bracket 42 of the compressor. Heat sink 2 has fins exposed from slit 9A provided in case 9. This structure prevents filler resin from leaking out of slit 9A, and allows the fins to direct vertically to improve the heat dissipation in air-cooling operation. Connector 6 has an edge exposed out of slit 9B for easy connection to an outer circuit. The structure discussed above allows the power controller to be downsized and integrated with the compressor. This structure thus reduces substantially the capacity occupied by the power controller in the refrigerating system. Second board 4 is placed in parallel with first board 1 having heat sink 2, and coupled to first board 1 via a lead frame. Smoothing capacitor 7 is placed on second board 4 and at a side opposite to heat sink 2. This placement prevents capacitor 7 from being affected by the heat dissipated from the heating components.

Figure 5:
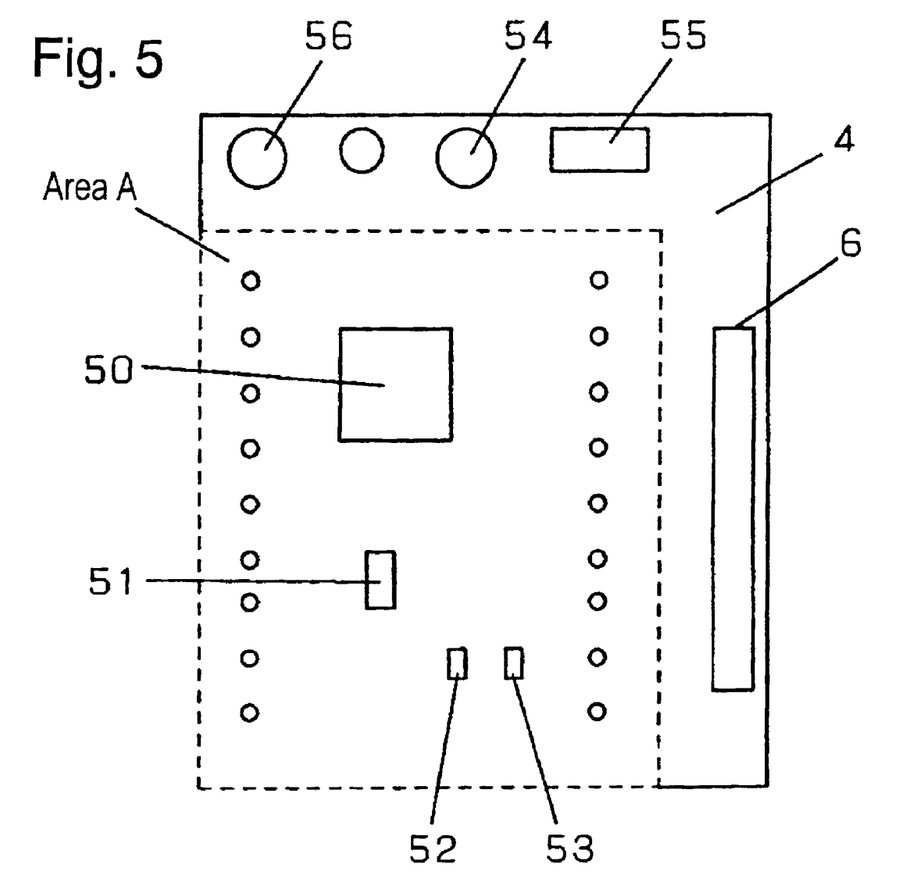
FIG. 5 is a plan view of a first board in accordance with embodiment 1.

FIG. 5 is a plan view of second board 4 in accordance with embodiment 1. First board 1 is mounted above area A shown as dotted lines. In the area A, low-profile components such as microprocessor 50, IC 51, chip resistor 52, chip capacitor 53 are disposed. In the other areas, high-profile components such as connector 6, electrolytic capacitor 54, discrete components 55 and coil 56 are disposed. The structure discussed above can minimize the length of lead-frame 1A of first board 1, thereby increasing the mechanical strength and downsizing the power controller.

Figure 6:
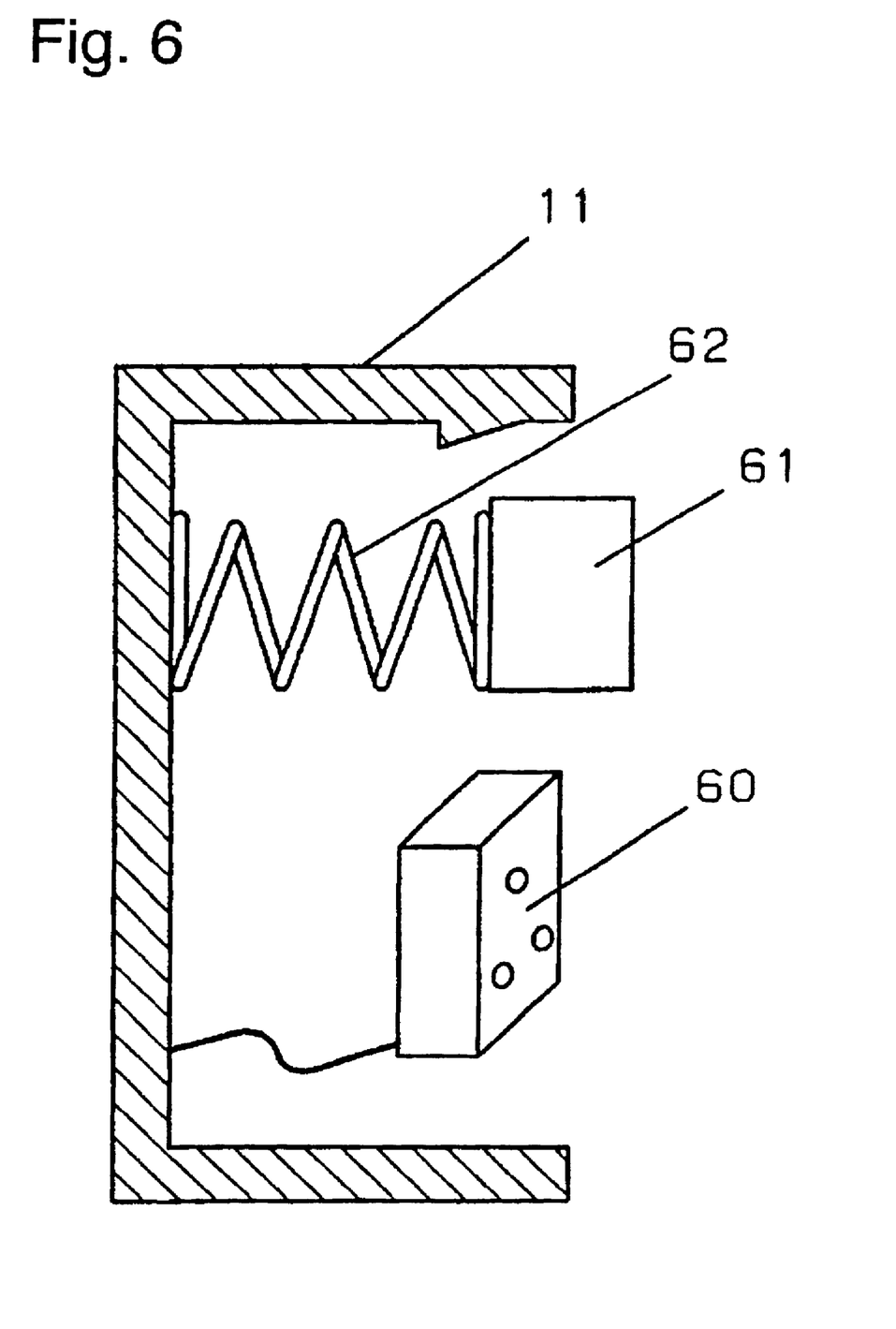
FIG. 6 is an enlarged view of fixing section 11 in accordance with embodiment 1.

FIG. 6 is an enlarged view of fixing section 11 in accordance with embodiment 1. Cluster socket 60 is connected to cluster pins, which couple the compressor motor electrically with the outside. Temperature detector 61 is a bi-metal having a mechanical contact, or a thermistor. Detector 61 detects a surface temperature of the compressor, and inputs an output signal to the power controller to the compressor from an abnormal temperature rise. Resilient supporting member 62 has a first end fixed to fixing section 11, and has a second end fixed to temperature detector 61. When fixing section 11 is mounted to the compressor, resilient supporting member 62 is pressed, and urges detector 61 against the surface of the compressor, so that detector 61 solidly adheres to the surface of the compressor. Temperature detector 61 can thus positively detect a protective status. A number of steps for mounting the temperature detector can be reduced, and as a result, a number of assembling steps is reduced.

Heating components 3 including semiconductor elements housed in a package are described in embodiment 1, however, semi-conductor chips can be connected to the first board by wire-bonding as a chip.

First board 1, being described as a board made of a lead-frame and resin, can be a highly heat dissipating board such as a metal base board.

Exemplary Embodiment 2

Figure 7:
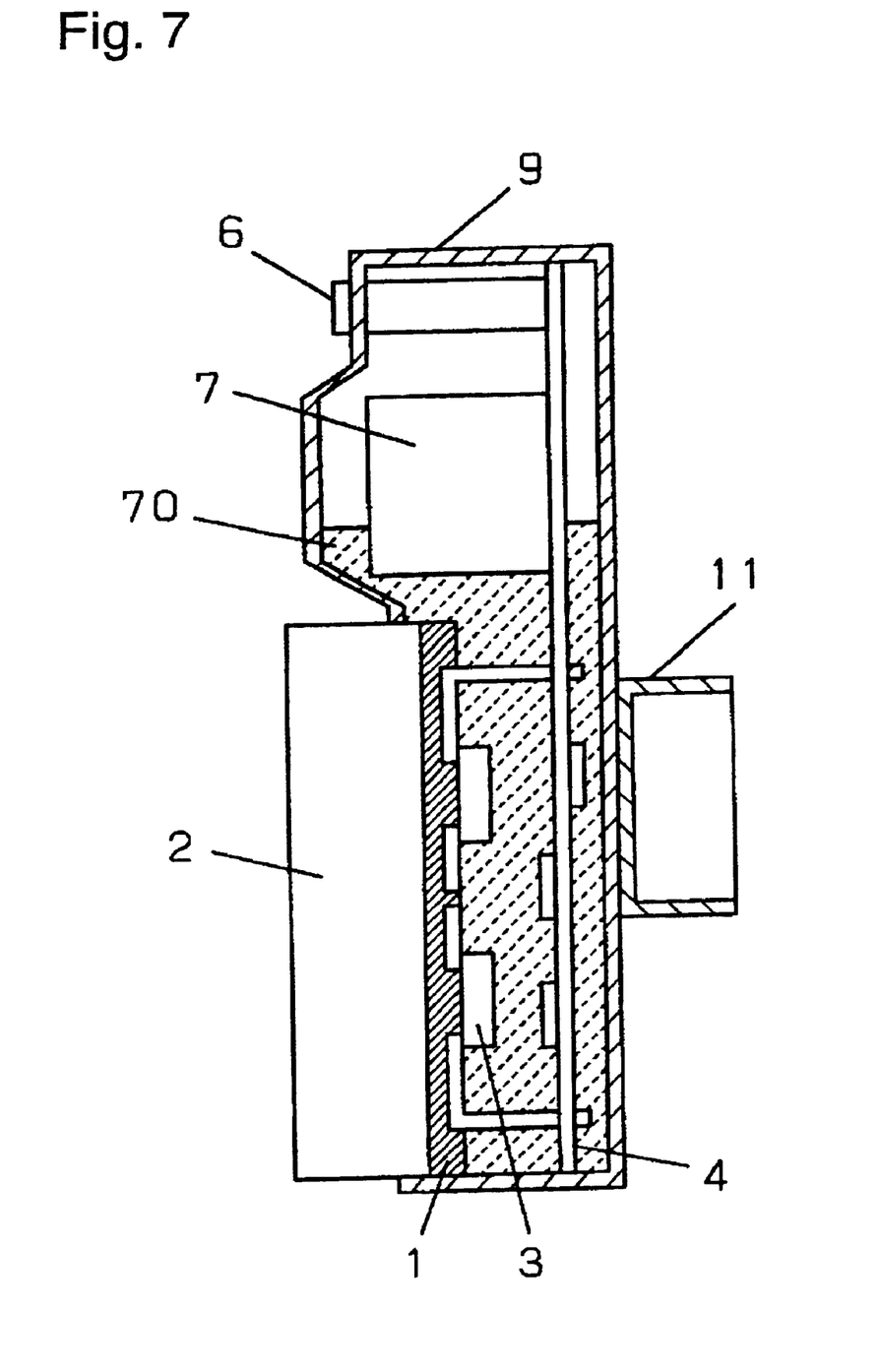
FIG. 7 is a sectional view of a power controller of a refrigerating system in accordance with exemplary embodiment 2.

FIG. 7 is a sectional view of a power controller of a refrigerating system in accordance with exemplary embodiment 2. This is a vertical sectional view with respect to a mounted compressor. First board 1, heat sink 2, second board 4, connector 6, case 9 and fixing section 11 are the same as those shown in FIG. 1, and the detailed descriptions thereof are thus omitted here. Smoothing capacitor 7 is connected to second board 4, and placed on the same side of the heat sink. After the case is placed in the right position, resin 70 in high fluid condition is flowed into the case to bury entire first board 1 and one third of the capacitor. Resin 70 is then hardened by heating or the like. This structure allows the controller to be slimmer than that demonstrated in embodiment 1. Embodiment 2 can thus contribute to downsizing the controller. One third of the capacitor in height from the base is buried in resin 70, thereby increasing the mechanical strength.

Exemplary Embodiment 3

Figure 8:
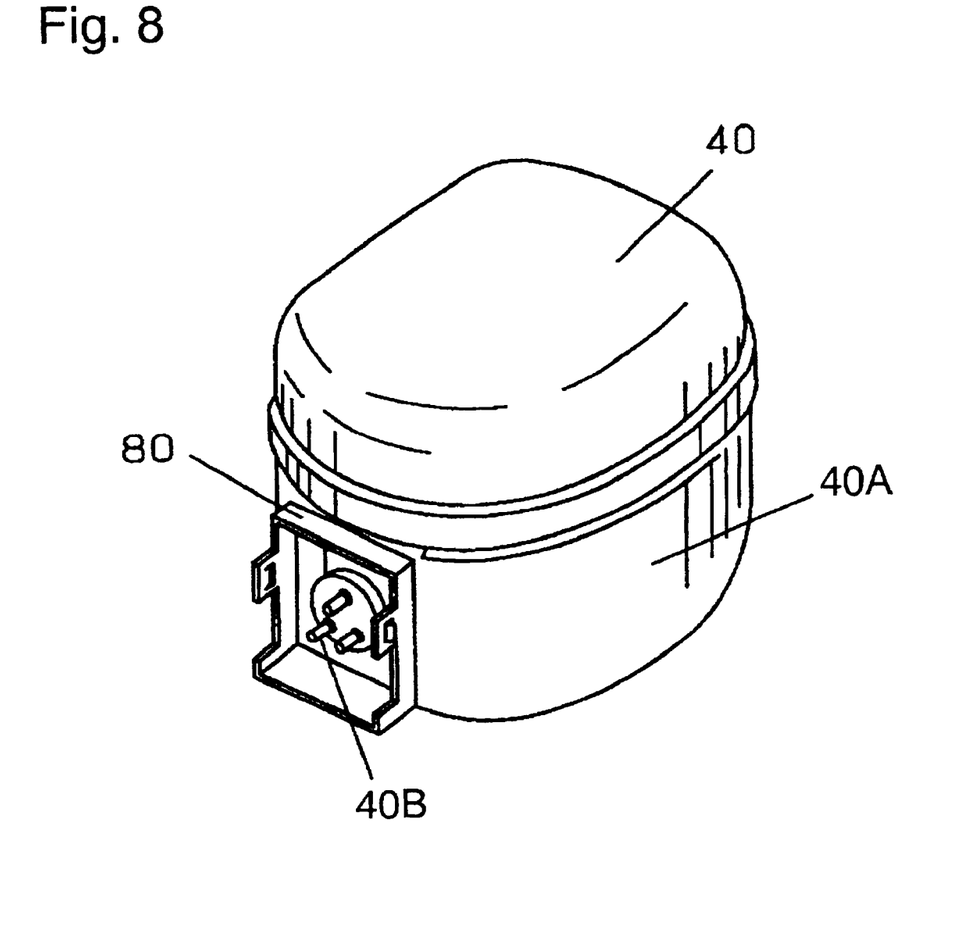
FIG. 8 is a perspective view of a compressor in accordance with exemplary embodiment 3.
Figure 9:
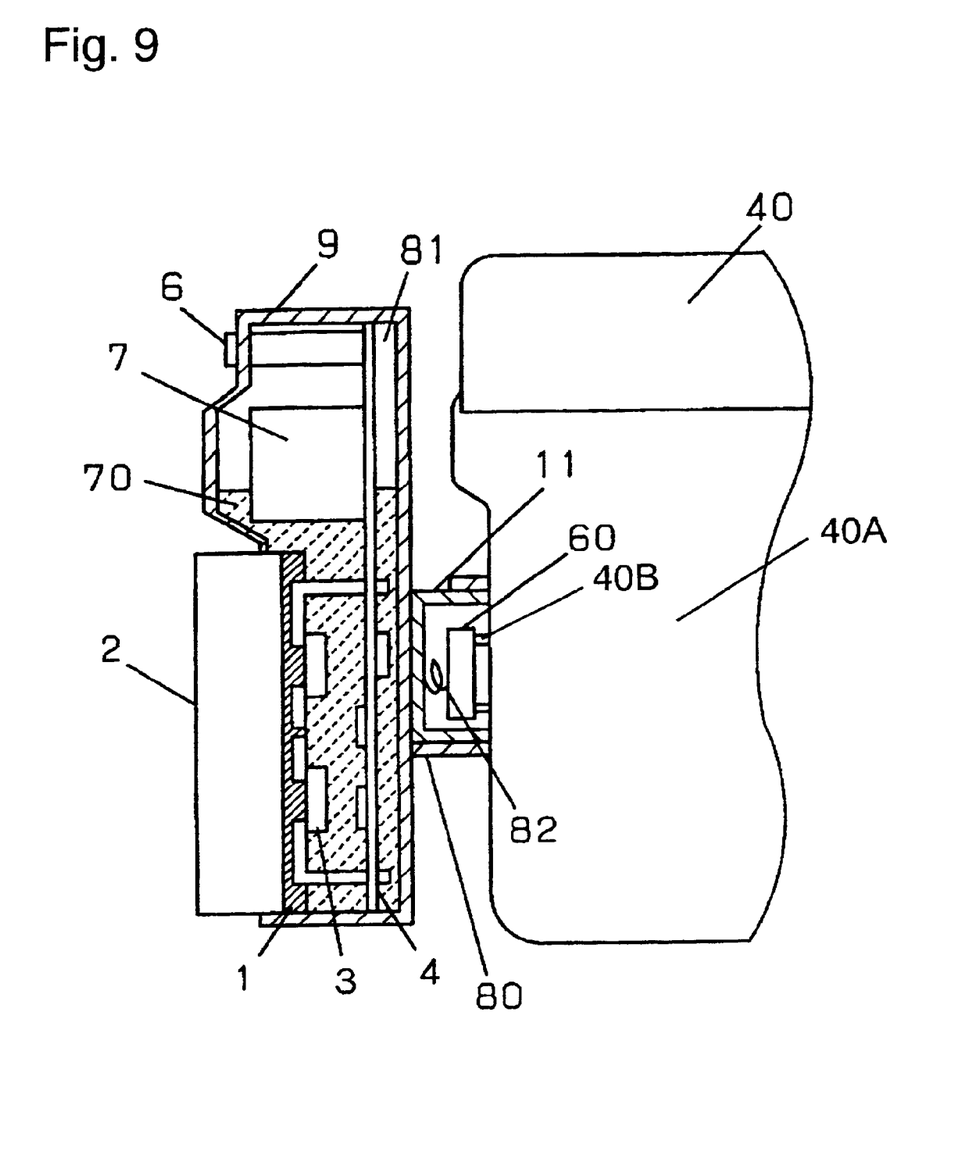
FIG. 9 is a lateral view illustrating the compressor shown in FIG. 8 having a case mounted thereon.

FIG. 8 is a perspective view of a compressor in accordance with exemplary embodiment 3. FIG. 9 is a lateral view illustrating the compressor shown in FIG. 8 housed by case 9. The elements similar to those in the previous embodiments are denoted by the same reference numbers, and the detailed descriptions thereof are thus omitted here. Compressor 40 has a compressive element and an electric element therein (both are not shown.) Container 40A has three conductive pins 40B for supplying electricity to the electric element. Fixing section 11 of case 9 is fixed to bracket 80 provided around pins 40B. Fixed section 11 can be fixed to bracket 80 by engaging a claw therewith, or by screwing down. Before fixing section 11 is fixed, cluster socket 60 extending from control board 81 via cable 82 is connected to pins 40B, then the fixing section is mounted. Control board 81 includes first board 1 and second board 4, and can be mounted directly to compressor 40, thereby downsizing the controller. Further, fixing section 11 of case 9, since being directly mounted to bracket 81, prevents pins 40 from a weight stress, and thus, are free from damages.

INDUSTRIAL APPLICABILITY

The present invention, as discussed above, relates to a power controller such as an inverter, which drives a compressor motor of a refrigerating system at variable speeds, and provides an inexpensive as well as a compact-size power controller.

In the power controller of the present invention, the controller, since being expected to have optimum heat dissipation, can be downsized and integrated into a compressor, and thus, can substantially reduce the capacity that the power controller occupies in the refrigerating system.

Fluid resin 10 flows and surrounds large-size smoothing capacitor 7 mounted on the board, and then, is hardened. Further, fixing section 11 is provided for fixing case 9 to the compressor. These arrangements strengthen the structure allows the power controller not to be affected by vibrations. Capacitor 7, since being placed away from first board 1 generating an amount of heat, is hardly affected by heat.

Resilient supporting member 62 is provided for urging temperature-detector 61 to the compressor when the controller is mounted to the compressor. The temperature detector for protecting the compressor solidly adheres to the compressor to positively detect the protective condition. This structure saves a number of steps for mounting a temperature-protection to the compressor, and thus reducing a number of assembling steps.

Second board 4 is larger than first board 1, and first board 1 is placed on a corner of second board 4. This allows high-profile components to be placed around the first board. This placement can shorten a frame of the first board, increase mechanical strength, and downsize the controller.

Second board 4 is placed in parallel with first board 1, and capacitor 7 is mounted on second board 4 in the same direction of first board 1. Then, resin is flowed into case 9, which accommodates first board 1, second board 4 and capacitor 7, to bury one third or less than one third of the capacitor in height, then the resin is hardened. This structure slims down and downsizes the power controller.

A control board is directly mounted to the compressor, so that the refrigerating system can be downsized.

Further, the case accommodating the control board is mounted to a bracket of the compressor, thereby relieving power-supplying pins of weight stress. The pins are thus free from damages.

REFERENCE NUMERALS

1 First Board
1A Lead Frame
1B Resin Sheet
2 Heat Sink
3 Power Element
4 Second Board
5 Microprocessor
6 Connector
7 Smoothing Capacitor
8 Fixing Resin
9 Case
9A Slit
9B Slit
10 Filler Resin
11 Fixing Section
11A Protrusion
20 Commercial Power Source
21 Converter
21A Rectifier Diode
21B Rectifier Diode
21C Electrolytic Capacitor
21D Electrolytic Capacitor
22 Inverter
22A IGBT
22B IGBT
22C IGBT
22D IGBT
22E IGBT
22F IGBT
23 Motor
24 Position Detector
25 Inverter Control Circuit
26 Power Supplying Circuit
27 Power Controller
28 Refrigerating System Control Circuit
29 Quick Refrigerating Switch
30 Temperature Input Circuit
31 Load-Driving Circuit
40 Capacitor
40A Container
40B Pin
41 Rubber Isolator
42 Mounting Bracket
43 Power Controller
44 Refrigerating System Control Board
45 Communication Cable
50 Microprocessor
51 IC
52 Chip Resistor
53 Chip Capacitor
54 Electrolytic Capacitor
55 Discrete Component
56 Coil
60 Cluster Socket
61 Temperature Detector
62 Resilient Supporting Member
70 Resin
80 Bracket
81 Control Board
82 Cable
101 Power Converter (Prior Art)
102 Radiator (Prior Art)
103 First Circuit Board (Prior Art)
104 First Spacer (Prior Art)
105 Smoothing Capacitor (Prior Art)
106 Voltage Regulator (Prior Art)
107 Second Circuit Board (Prior Art)
108 Second Spacer (Prior Art)
109 Cover (Prior Art)

What is claimed is:

1. A compressor comprising:

an electric element;

a first case for accommodating said electric element;

a conductive pin coupled with said electric element;

a bracket provided to said first case around said conductive pin;

a control board for controlling said electric element;

a second case for accommodating said control board;

a fixing section provided to said second case, for mounting said second case to said bracket; and a cluster socket extending from said control board via a cable, for being coupled to said conductive pin.

2. The compressor of claim 1, wherein said control board including:

a first board including an inverter mounted thereto;

a second board including a control circuit mounted thereto, said second board being placed in parallel with said first board; and a heat sink mounted to said first board, wherein said second case has a slit through which said heat sink extends outside said second case.

3. The compressor of claim 1, wherein said control board including:

a first board including an inverter mounted thereto;

a second board including a control circuit mounted thereto, said second board being placed in parallel with said first board; and a capacitor disposed on said second board at a side opposite to said first board, wherein said first and said second boards are fixed by fluid in resin to said second case.

4. The compressor of claim 1, further comprising:

temperature detecting means disposed in said bracket, for detecting a temperature of said first case; and a resilient supporting member for having said temperature detecting means solidly contact with said first case.

5. The compressor of claim 1, wherein said second board is larger than said first board, and said first board is placed over a corner of said second board.

* * * * *